(12) United States Patent
Marholev

(10) Patent No.: US 7,215,199 B2
(45) Date of Patent: May 8, 2007

(54) METHOD AND SYSTEM FOR SIMPLIFYING COMMON MODE FEEDBACK CIRCUITRY IN MULTI-STAGE OPERATIONAL AMPLIFIERS

(75) Inventor: Bojko Marholev, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 109 days.

(21) Appl. No.: 11/155,157

(22) Filed: Jun. 17, 2005

(65) Prior Publication Data
US 2006/0082416 A1 Apr. 20, 2006

Related U.S. Application Data

(60) Provisional application No. 60/619,081, filed on Oct. 15, 2004.

(51) Int. Cl.
*H03F 3/45* (2006.01)
(52) U.S. Cl. ........................... 330/258; 330/257
(58) Field of Classification Search ............ 330/258, 330/257, 261, 253
See application file for complete search history.

(56) References Cited

U.S. PATENT DOCUMENTS

| 5,422,529 A | * | 6/1995 | Lee | 327/536 |
| 6,703,898 B2 | * | 3/2004 | Renous | 330/253 |
| 6,717,467 B2 | * | 4/2004 | Renous et al. | 330/253 |

* cited by examiner

*Primary Examiner*—Henry Choe
(74) *Attorney, Agent, or Firm*—McAndrews, Held & Malloy, Ltd

(57) ABSTRACT

A method for simplifying common mode feedback circuitry utilized in multi-stage operational amplifiers may comprise generating a first differential output signal by a first amplifying circuit in an amplifying stage and communicating the first differential output signal to a first output of the amplifying stage. A second amplifying circuit in the amplifying stage may generate a second differential output signal that may be communicated to a second output of the amplifying stage. The second differential output signal may be fed back to a first feedback circuit in the amplifying stage, and the first differential output signal may be fed back to a second feedback circuit in the amplifying stage. Additionally, the first and the second differential output signals may be fed back to the second feedback circuit and the first feedback circuit, respectively, in a first amplifying stage and/or any one or more of succeeding amplifying stages.

34 Claims, 6 Drawing Sheets

METHOD AND SYSTEM FOR SIMPLIFYING COMMON MODE FEEDBACK CIRCUITRY IN MULTI-STAGE OPERATIONAL AMPLIFIERS

CROSS-REFERENCE TO RELATED APPLICATIONS/INCORPORATION BY REFERENCE

This application makes reference to, claims priority to, and claims the benefit of U.S. Provisional Application Ser. No. 60/619,081, filed Oct. 15, 2004.

The above stated application is hereby incorporated herein by reference in its entirety.

FIELD OF THE INVENTION

Certain embodiments of the invention relate to amplifier circuitry. More specifically, certain embodiments of the invention relate to a method and system for simplifying common mode feedback circuitry in multi-stage operational amplifiers.

BACKGROUND OF THE INVENTION

A transistor is an electronic device that controls voltage and current flow. In order to mitigate the effects of impairments such as noise, transistors may be arranged so that they form a differential amplifier. A differential amplifier may be designed such that its outputs are proportional to a difference between two inputs to the differential amplifier, and, therefore, any error that may be common to both inputs may be ignored. These errors may include internal and/or external errors. Internal errors due to temperature changes may affect voltage and current characteristics of the transistors on both sides of the differential amplifier to approximately the same degree. This may occur in instances where the transistors are on the same chip and may have the same process variations.

External errors may include noise picked up by inputs of the differential amplifier. Since both signals to the two inputs of the differential amplifier may pick up the same noise, the noise may not affect the output. This may occur because the same noise on both inputs may not affect the difference between the two inputs. The noise common to both inputs may be referred to as common mode noise. In this regard, the differential amplifier may be adapted to eliminate common mode noise.

Differential amplifiers may form the basis of operational amplifiers, which may also be referred to as op amps. An operational amplifier is basically a differential amplifier having a large voltage gain, very high input impedance and low output impedance. The operational amplifier has an "inverting" or negative (−) input and "non-inverting" or positive (+) input, and one or two outputs. The high input impedance allows minimal current in to the inputs of the operational amplifier. This feature may be used with a feedback circuit, in which an output of the operational amplifier circuit depends for the most part on the feedback circuit. Often, analysis of a circuit utilizing an operational amplifier may assume the operational amplifiers to be ideal operational amplifiers. An ideal operational amplifier has infinite input impedance, zero output impedance, infinite open loop gain when there is no feedback, and infinite bandwidth.

Some operational amplifiers, such as type 741 by Fairchild Semiconductor, may have very high open loop gain on the order of several hundred thousand, but very low open loop bandwidth of 10 hertz or less. With the addition of feedback devices, for example, resistors, the closed loop bandwidth may be increased at the sacrifice of the closed loop gain. Generally, the gain-bandwidth product for an operational amplifier, which may be the gain multiplied by the bandwidth for a specific feedback configuration, may be a constant. Operational amplifiers may have a single output or differential outputs. Differential-output operational amplifiers may have outputs whose voltage levels are centered about a common mode voltage, which may be a reference voltage, and the average of the output voltages may be the common mode voltage.

Common mode noise may affect the differential outputs so that the common mode voltage may move to a level other than the desired reference voltage. Therefore, in order to reduce the effect of the common mode noise and to keep the common mode voltage at the desired reference voltage, a feedback circuit may be implemented as part of the differential-output operational amplifier. Some feedback circuit may utilize a voltage comparator and resistors. However, the drawback to this may be additional power and layout area needed.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method for simplifying common mode feedback circuitry in multi-stage operational amplifiers, substantially as shown in and/or described in connection with at least one of the drawings, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for simplifying common mode feedback circuitry in multi-stage operational amplifiers. In accordance with an embodiment of the invention, the method and system for simplifying common mode feedback circuitry in multi-stage operational amplifiers may be employed in circuitry such as active filters, image reject filters, amplifiers, integrators, or other similar types of circuitry in which an operational amplifier may be utilized.

Aspects of the invention may comprise generating a first differential output signal by a first amplifying circuit in an amplifying stage and communicating the first differential output signal to a first output of the amplifying stage. A second amplifying circuit in the amplifying stage may generate a second differential output signal that may be communicated to a second output of the amplifying stage. The second differential output signal may be fed back to a first feedback circuit in the amplifying stage, and the first differential output signal may be fed back to a second feedback circuit in the amplifying stage. Additionally, the first and the second differential output signals may be fed back to the second feedback circuit and the first feedback circuit, respectively, in a first amplifying stage and/or any one or more of succeeding amplifying stages.

The first feedback circuit may comprise a gate of a first transistor coupled to a gate of a second transistor. The first transistor may be configured as a diode connected transistor by coupling a drain of the first transistor to the gate of the first transistor. The second transistor may mirror current in the first transistor. The second output may be cross-coupled to a drain of the second transistor. The second feedback circuit may comprise a gate of a third transistor coupled to a gate of a fourth transistor. The third transistor may be configured as a diode connected transistor by coupling the gate of the third transistor to a drain of the third transistor. The fourth transistor may mirror current in the third transistor. The first output may be cross-coupled to a drain of the fourth transistor.

Figure 1A:
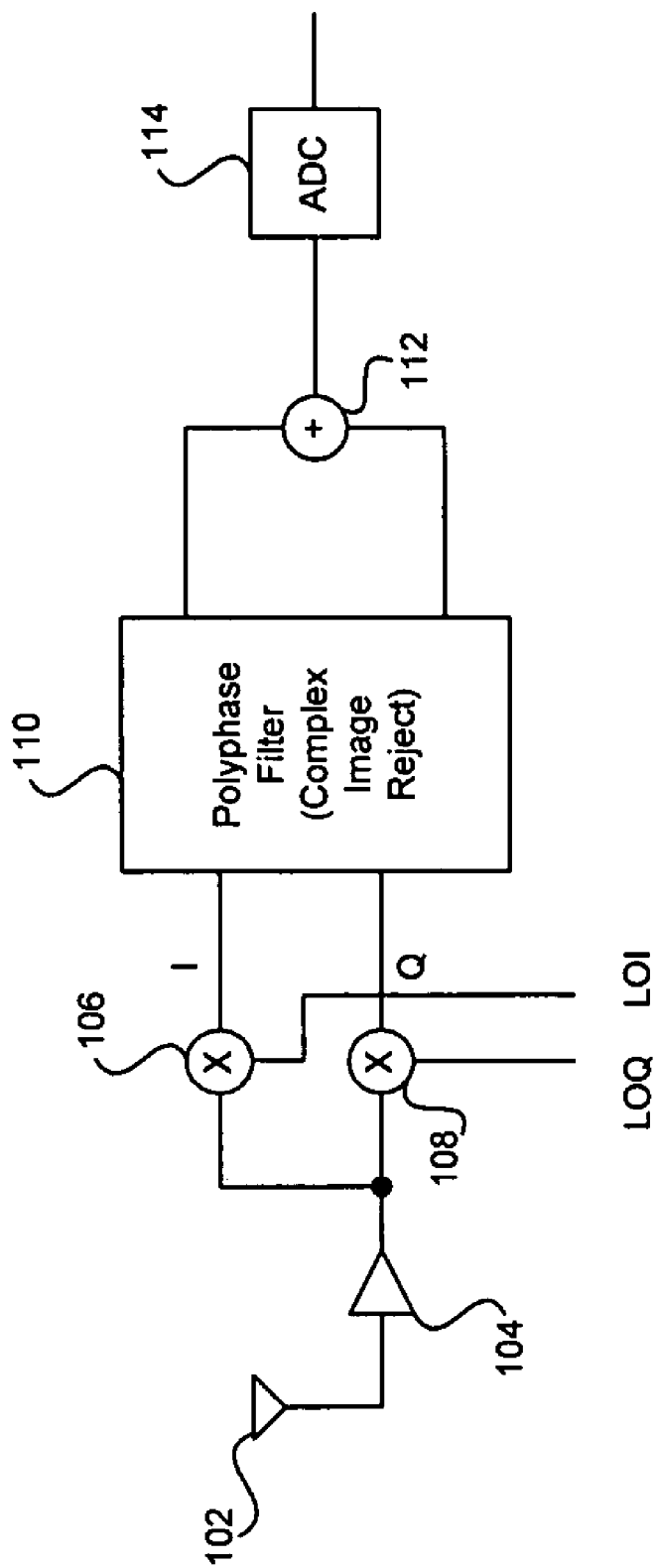
FIG. 1a is a block diagram of an exemplary receiver path for a receiver, which may be utilized in connection with an embodiment of the invention.

FIG. 1a is a block diagram of an exemplary receiver path for a receiver, which may be utilized in connection with an embodiment of the invention. Referring to FIG. 1a, there is shown an antenna 102, a low noise amplifier (LNA) 104, an in-phase (I) mixer 106, a quadrature (Q) mixer 108, a filter 110, a summer 112 and an analog-to-digital converter (ADC) 114. The filter 110 may be, for example, an active filter. There is also shown local oscillator signals LOI and LOQ.

In operation, RF signals may be received by the antenna 102 and amplified by the LNA 104. The amplified RF signal at the output of the LNA 104 may be communicated to the in-phase and quadrature mixers 106 and 108. The amplified RF signal at the in-phase and quadrature mixers 106 and 108 may be mixed with local oscillator signals LOI and LOQ, respectively. The outputs of the in-phase and quadrature mixers 106 and 108 may be the in-phase and quadrature components of the received RF signal. The in-phase and quadrature components are orthogonal to each other and may be communicated to the filter 110. The filter 110 may be adapted to attenuate unwanted image frequencies. The filter 110 may be a polyphase filter that utilizes an operational amplifier circuit to reject out-of-band frequencies. The in-phase and quadrature component outputs of the filter 110 may be added together by the summer 112. The output of the summer 112 may be communicated to the ADC 114 where the analog signal may be converted to digital values.

Figure 1B:
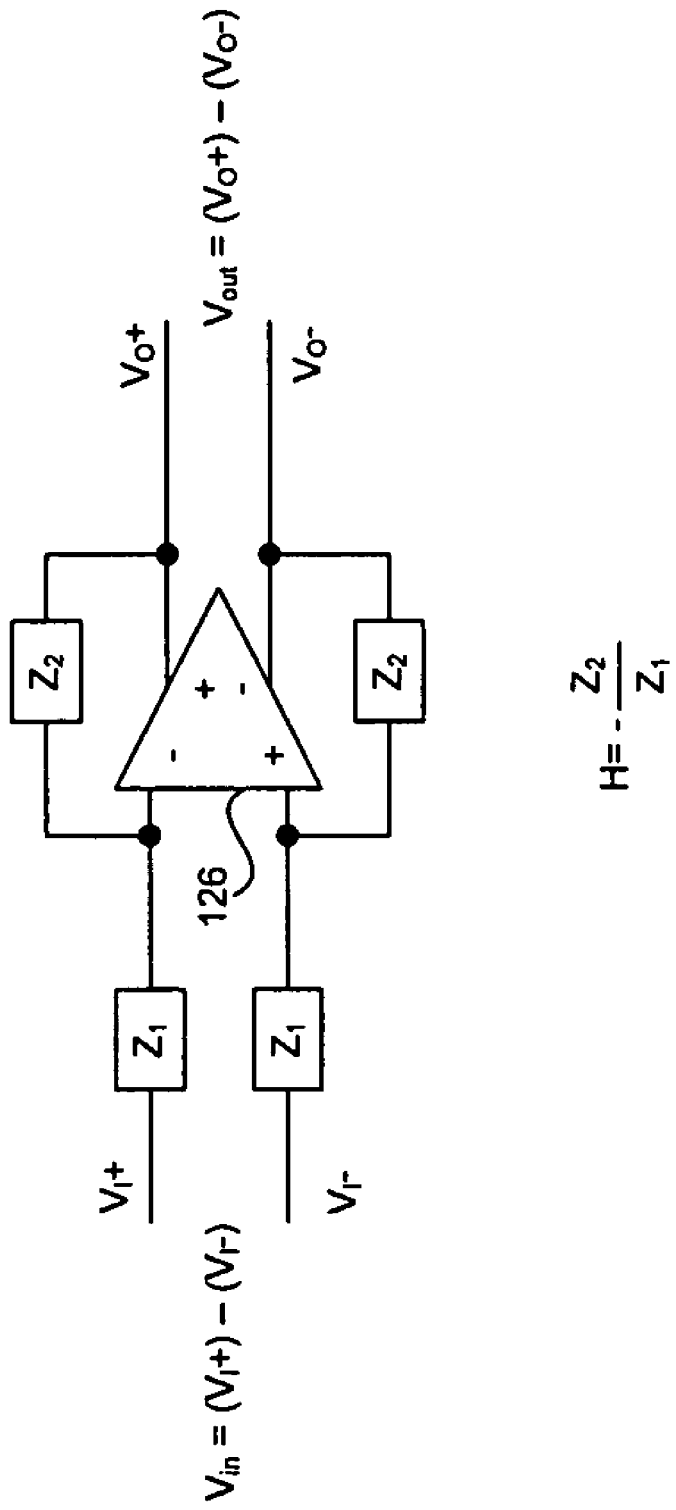
FIG. 1b illustrates an exemplary operational amplifier configuration that may be part of the filter with respect to FIG. 1a, which may be utilized in connection with an embodiment of the invention.

FIG. 1b illustrates an exemplary operational amplifier configuration that may be part of the filter with respect to FIG. 1a, which may be utilized in connection with an embodiment of the invention. Referring to FIG. 1b, there is shown a plurality of loads represented by impedances $Z_1$ and $Z_2$, and a differential operational amplifier 126. Each of the impedances $Z_1$ and $Z_2$ may comprise capacitive and/or resistive components. Although only a single stage is illustrated, a plurality of n stages may be cascaded to create an n-stage filter design.

In the amplifier arrangement of FIG. 1b, the transfer function (H), which describes the relationship between the input and the output, may be given by:

$$H = -(Z_2/Z_1)$$

The transfer function is negative since the output is inverted with respect to the input. The input voltage $V_{in}$ may be expressed as a difference of the voltage $V_I+$ and the voltage $V_I-$, and the output voltage $V_{out}$ may be expressed as the difference of the voltages $V_O+$ and $V_O-$:

$$V_{in} = (V_I+) - (V_I-),$$

$$V_{out} = (V_O+) - (V_O-).$$

In order to simplify calculations, the property of an ideal operational amplifier in which there is no current input in to the operational amplifier may be utilized. The current of the circuit for the negative input of the operational amplifier 126 may then be expressed as:

$$(V_I+)/Z_1 = -(V_O+)/Z_2,$$

where the negative sign may indicate that the currents are flowing in opposite directions. Therefore, $$V_O+ = -(V_I+)(Z_2/Z_1)$$

Similarly, the current of the circuit for the positive input of the operational amplifier 126 is:

$$(V_I-)/Z_1 = -(V_O-)/Z_2,$$

and, therefore, $$V_O- = -(V_I-)(Z_2/Z_1).$$

From this, the transfer function may be calculated for the difference of the output voltages with respect to the difference of the input voltages:

$$\begin{aligned}(V_O+) - (V_O-) &= -(V_I+)(Z_2/Z_1) - (-(V_I-)(Z_2/Z_1)) \\ &= -(V_I+)(Z_2/Z_1) + (V_I-)(Z_2/Z_1) \\ &= -((V_I+) - (V_I-))(Z_2/Z_1) \\ &= -V_{in}(Z_2/Z_1).\end{aligned}$$

Hence, the transfer function $-(Z_2/Z_1)$ applies to the output voltages $V_O+$ and $V_O-$ with respect to the input voltages $V_I+$ and $V_I-$, respectively, as well as to the difference of the output voltages $V_{out}$ with respect to the difference of the input voltages $V_{in}$.

Figure 1C:
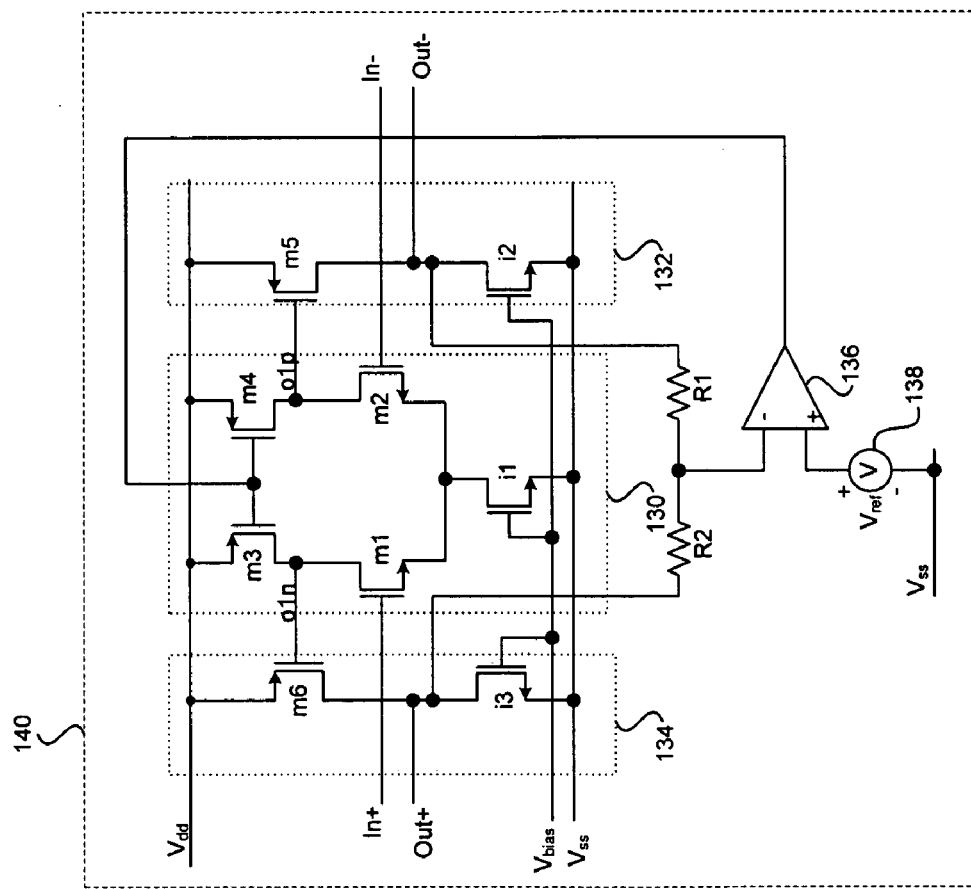
FIG. 1c is a circuit diagram illustrating the exemplary operational amplifier configuration illustrated in FIG. 1b, which may be utilized in connection with an embodiment of the invention.

FIG. 1c is a circuit diagram illustrating the exemplary operational amplifier configuration illustrated in FIG. 1b, which may be utilized in connection with an embodiment of the invention. Referring to FIG. 1c, there is shown an input amplifying stage 130, a first output amplifying stage 132, a second output amplifying stage 134 of a differential-output operational amplifier, resistors R1, R2, comparator 136, and reference voltage source ($V_{ref}$) 138. The comparator 136 may be an amplifier with a finite gain. These components may be on a chip 140. The input amplifying stage 130 comprises transistors m1, m2, m3, m4 and a transistor i1 configured as a current source. The first amplifier output stage 132 comprises a transistor m5, a transistor i2 configured as a current source, and an output Out−. The second amplifier output stage 134 comprises a transistor m6, a transistor i3 configured as a current source, and an output Out+. The output Out− of the first output stage 132 and the output Out+ of the second output stage 134 may be differential outputs. The input amplifying stage 130 comprises differential inputs In+ and In−. The transistors m1, m2, m3, m4 may be configured in a differential amplifier arrangement. Transistors m3, m4, m5, m6 are PMOS transistors and transistors m1, m2 are NMOS transistors. The transistors i1, i2, i3 may be NMOS transistors, and a gate of each transistor may be coupled to a voltage $V_{bias}$. A source of each of the transistors m3, m4, m5, and m6 may be coupled to a higher voltage potential $V_{dd}$ of a power supply.

A drain of transistor m4 may be coupled to a drain of transistor m2 so that it may function as a first differential output o1p of the input amplifying stage 130. A drain of transistor m3 may be coupled to a drain of transistor m1 so that it may function as a second differential output o1n of the input amplifying stage 130. The first differential output o1p of the input amplifying stage 130 may be coupled to a gate of transistor m5 to drive the transistor m5 and the second differential output o1n of the input amplifying stage 130 may be coupled to a gate of transistor m6 to drive the transistor m6. A source of the transistor m1 may be coupled to a source of the transistor m2, and also to a drain of the transistor i1. A drain of the transistor m5 may be coupled to a drain of the transistor i2, and a source of the transistor i2 may be tied to a lower voltage potential $V_{ss}$ of a power supply. Similarly, a drain of the transistor m6 may be coupled to a drain of the transistor i3, and a source of the transistor i3 may be tied to a lower voltage potential $V_{ss}$ of a power supply.

The resistors R1 and R2, comparator 136, and reference voltage source ($V_{ref}$) 138 may be utilized to set the common mode voltage at the outputs Out+ and Out−. A first terminal of the resistor R1 may be coupled to the output Out− of the first output amplifying stage 132 and a first terminal of the resistor R2 may be coupled to the output Out+ of the second output amplifying stage 134. A second terminal of each of the resistors R1 and R2 may be coupled together, and both may be coupled to a negative input of the comparator 136. The gates of the PMOS transistors m3 and m4 may be coupled together, and both may be coupled to an output of the comparator 136.

The resistors R1, R2, the comparator 136, and reference voltage source Vref 138 may be adapted to form a common mode feedback loop. In this regard, the common mode feedback loop may be adapted to sense the output voltage at the output Out− of the first output amplifying stage 132 and the output voltage at the output Out+ of the second output amplifying stage 134, average the output voltages via the resistors R1 and R2, and adjust the outputs of the transistors m3 and m4. The comparator 136 may be adapted to act as a voltage comparator where it compares the average output voltage with a reference voltage output by the reference voltage source 138. The output voltage of the comparator 136 may vary as the average output voltage varies with respect to the reference voltage from the reference voltage source 138. Accordingly, the output voltage of the comparator 136 may adjust the voltage at the gates of transistors m3 and m4. This may increase or decrease the direct current (DC) offset of the outputs o1n and o1p of the transistors m3 and m4, respectively. The outputs o1n and o1p may in turn affect the outputs Out+ and Out− of the transistors m6 and m5, respectively.

Although a DC offset voltage of the outputs Out+ and Out− may accurately track the reference voltage $V_{ref}$, the circuitry of FIG. 1c requires a feedback loop that utilizes the comparator 136 and the resistors R1 and R2. As a result, more current may be required for the feedback circuit, which increases power consumption, as well as the larger layout area required on the chip 140 for the comparator 136 and the resistors R1 and R2.

The values of the higher voltage potential $V_{dd}$ and the lower voltage potential $V_{ss}$ of the power supply may be design and implementation dependent. For example, an implementation may require the higher voltage potential $V_{dd}$ to be 3.3 volts and the lower voltage potential $V_{ss}$ to be 0 volts.

Figure 2:
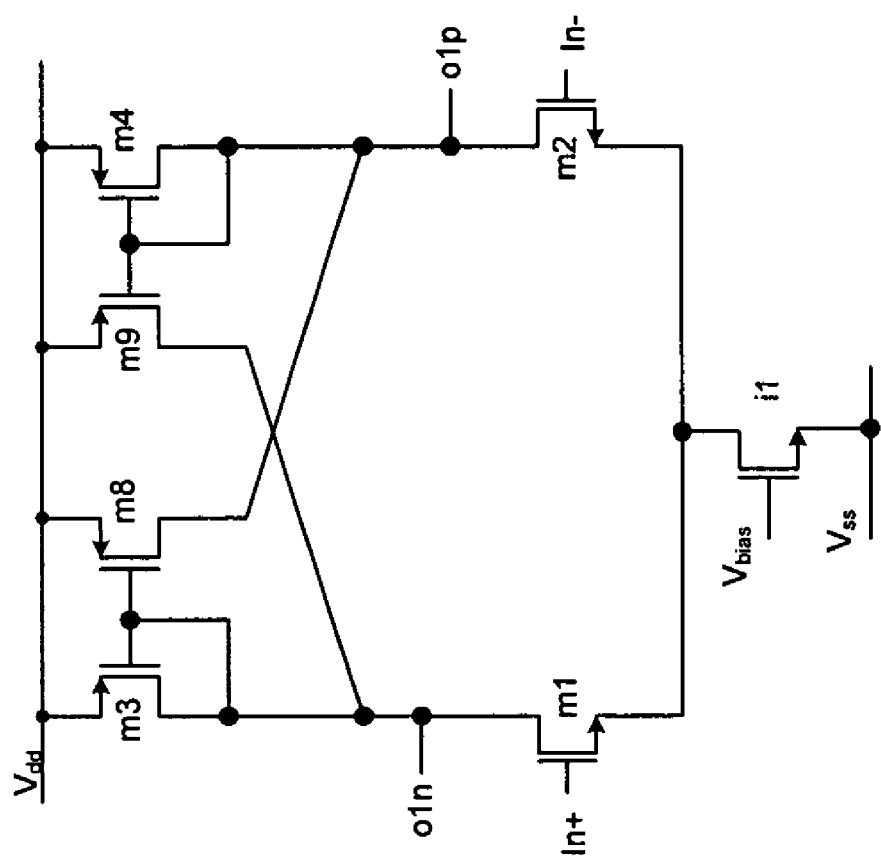
FIG. 2 is a circuit diagram illustrating an operational amplifier architecture that may be utilized in connection with an embodiment of the invention.

$V_{dd}$ FIG. 2 is a circuit diagram illustrating an input stage of an operational amplifier architecture that may be utilized in connection with an embodiment of the invention. Referring to FIG. 2, there is shown transistors i1, m1, m2, m3, m4, m8, and m9. Transistors m3, m4, m8 and m9 may be PMOS transistors and transistors m1, m2 may be NMOS transistors. A gate of each of the transistors m1 and m2 may be coupled to the inputs In+ and In−, respectively.

A source of each of the transistors m3, m4, m8 and m9 may be coupled to a higher voltage potential $V_{dd}$ of a power supply, and the transistors m3, m4, m8 and m9 may be of equal size. The transistor m3 may be configured as a diode connected transistor by coupling a gate of the transistor m3 to a drain of the transistor m3. The gate of the transistor m3 may also be coupled to a gate of the transistor m8 in a current mirror configuration. In this current mirror configuration, the same amount of current may flow through the transistor m8 as flows through the transistor m3 since the two transistors may have a common gate voltage and be of equal size. A drain of the transistor m3 may be coupled to a drain of the transistor m1, a drain of the transistor m9, and to the output o1n.

In a similar fashion, a gate of the transistor m4 may be coupled to a gate of the transistor m9 and also to a drain of the transistor m4. In this current mirror configuration, the same amount of current may flow through the transistor m9 as flows through the transistor m4 since the two transistors may have a common gate voltage and be of equal size. A drain of the transistor m4 may be coupled to a drain of the transistor m2, a drain of the transistor m8, and to the output o1p. Inputs In+ and In− may be coupled to a gate of each of the transistors m1 and m2, respectively. A source of the transistor m1 may be coupled to a source of the transistor m2, and to a drain of the transistor i1. The transistor i1 may be configured as a current source. A source of the transistor i1 may be coupled to a lower potential $V_{ss}$ of a power supply.

The circuit of FIG. 2 may eliminate the need for an operational amplifier and averaging resistors in a common mode feedback loop, for example, the comparator 136 (FIG. 1c) and the resistors R1 and R2 (FIG. 1c). In this regard, the DC offset voltage at the output o1p may be defined by:

$$o1p = V_{dd} - V_{sg4},$$

where $V_{sg4}$ is source to gate voltage of transistor m4 that is defined by the electrical and physical properties of the transistor. To a first order, a MOS transistor in saturation mode may have the $V_{gs}$ voltage defined by $$V_{gs}=((I_d*L)/(k*W))^{1/2}-V_t$$

where Id is the drain current, L is the transistor length, k is a constant process parameter and W is the width of the transistor. A saturated MOS transistor may have the characteristic $$|V_{ds}|>=|V_{gs}-V_t|$$

where $V_{ds}$ is drain to source voltage, $V_{gs}$ is gate to source voltage, and $V_t$ is the MOS transistor threshold voltage.

Furthermore, the DC offset voltage at the output o1n may also be defined by:

$$o1n=V_{dd}-V_{sg3},$$

where $V_{sg3}$ is the source to gate voltage of transistor m3. Since the transistors m3 and m4 are on the same chip, they may have similar process characteristics. Therefore, the source to gate voltages $V_{sg3}$ and $V_{sg4}$ may be same, and, hence, the DC offset voltage may be same at the outputs o1p and o1n.

The output impedances at the outputs o1n and o1n are described below. In order to simplify transistor circuit descriptions, all transistors may be considered to be ideal transconductors with infinite output impedances, where a voltage input results in a current output. Therefore, the infinite output impedances of m1 and m2 may not contribute to the overall output impedance with respect to o1n and o1p. The definition of transconductance (gm) is the standard definition:

$$gm=I_{out}/V_{in}.$$

For differential signals, in which $V_{in}+=-V_{in}-$ and $V_{o1n}=-V_{o1p}$, the output impedance at the output o1n may be given by:

$$Z_{o1n}=1/(gm3-gm9),$$

where gm3 and gm9 are transconductances of the transistors m3 and m9, respectively. Similarly, at output o1p the output impedance for differential signals is given by:

$$Z_{o1p}=1/(gm4-gm8),$$

where gm4 and gm8 are transconductances of the transistors m4 and m8, respectively.

For common mode signals, in which $V_{in}+=V_{in}-$ and $V_{o1n}=V_{o1p}$, the impedance at the output o1n may be given by:

$$Z_{o1n}=1/(gm3+gm9).$$

Similarly at output o1p the impedance for common mode signals may be:

$$Z_{o1p}=1/(gm4+gm8)$$

Therefore, if the transistors m3, m4, m8, and m9 are fabricated so that their transconductances are equal, that is, gm3=gm4=gm8=gm9, the amplifier circuit in FIG. 2, may provide a high gain for differential signals and a low gain for common mode signals. This is because the output voltage may be thought of as the output current times the output impedance. Therefore, for a current, a higher output impedance may result in a higher voltage with respect to a lower output impedance.

Figure 3A:
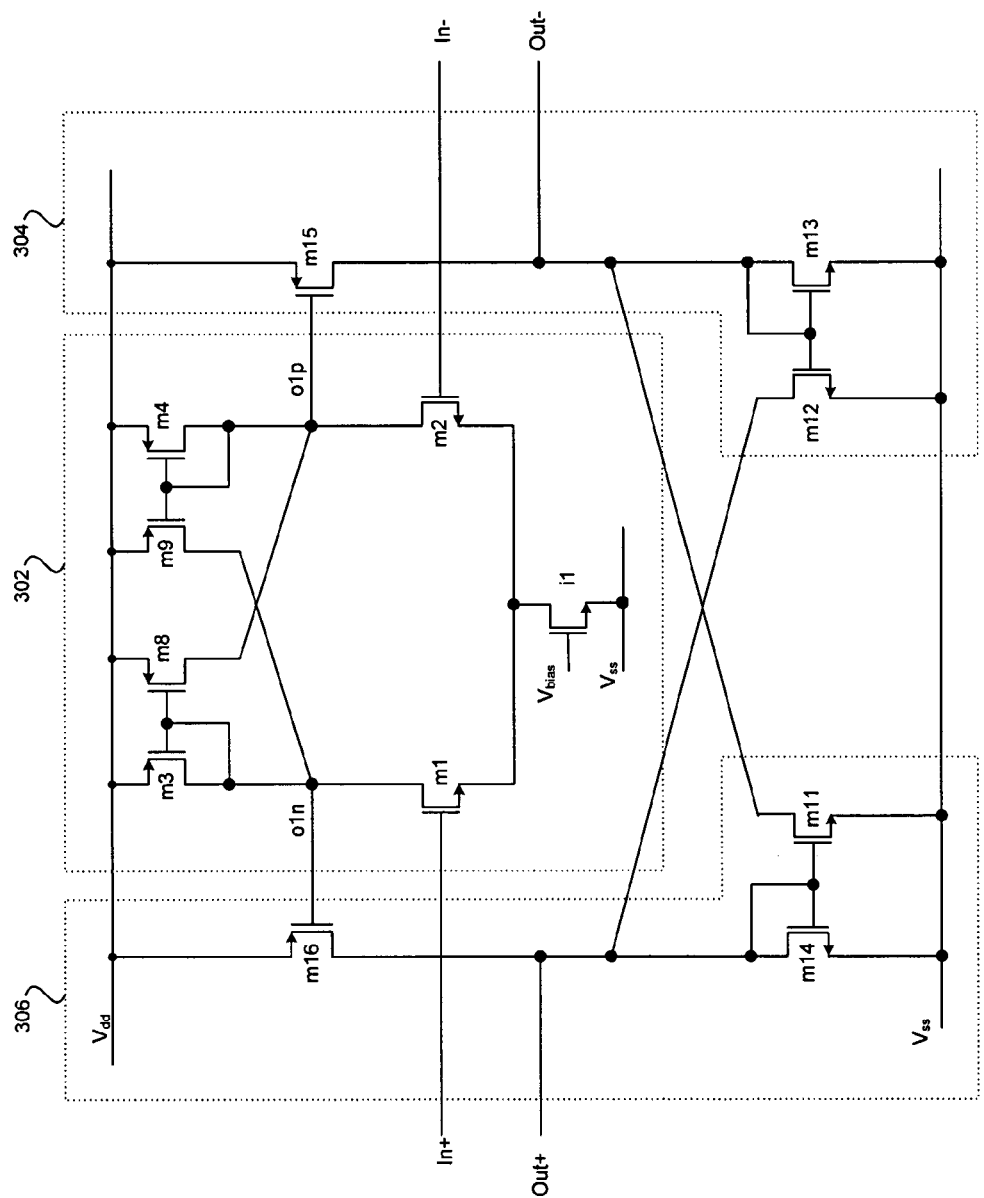
FIG. 3a is a circuit diagram illustrating a two-stage operational amplifier architecture with simplified common mode feedback circuitry, in accordance with an embodiment of the invention.

FIG. 3a is a circuit diagram illustrating a two-stage operational amplifier architecture with simplified common mode feedback circuitry, in accordance with an embodiment of the invention. Referring to FIG. 3a, there is shown a two stage differential-output amplifier comprising an input amplifying stage 302, a first output amplifying stage 304, and a second output amplifying stage 306. The input amplifying stage 302 may comprise transistors m1, m2, m3, m4, m8, m9 and a transistor i1. The transistors m3, m4, m8 and m9 may be PMOS transistors of the same size and the transistors m1, m2 may be NMOS transistors of the same size. The transistor i1 may be a NMOS transistor configured as a current source and may provide a bias current for the input amplifying stage 302. The first output amplifying stage 304 may comprise transistors m12, m13, and m15. The transistor m15 may be a PMOS transistor and the transistors m12 and m13 may be NMOS transistors. The second output amplifying stage 306 may comprise transistors m11, m14, and m16. The transistor m16 may be a PMOS transistor and the transistors m11 and m14 may be NMOS transistors. A gate of each of the transistors m1 and m2 may be coupled to inputs In+ and In−, respectively. There is also shown outputs Out+ and Out−.

In the input amplifying stage 302, a source of each of the transistors m3, m4, m8 and m9 may be coupled to a higher voltage potential $V_{dd}$ of a power supply. The transistor m3 may be configured as a diode connected transistor by coupling a gate of the transistor m3 to a drain of the transistor m3. The gate of the transistor m3 may also be coupled to a gate of the transistor m8 in a current mirror configuration. In this current mirror configuration, the same amount of current may flow through the transistor m8 as flows through the transistor m3 since the two transistors may have a common gate voltage and be the same size. A drain of the transistor m8 may be coupled to a drain of the transistor m4, to a drain of the transistor m2, and to a gate of the transistor m15.

The transistor m4 may be configured as a diode connected transistor by coupling a gate of the transistor m4 to a drain of the transistor m4. The gate of the transistor m4 may also be coupled to a gate of the transistor m9 in a current mirror configuration. In this current mirror configuration, the same amount of current may flow through the transistor m9 as flows through the transistor m4 since the two transistors may have a common gate voltage and be the same size. A drain of the transistor m9 may be coupled to a drain of the transistor m3, to a drain of the transistor m1, and to a gate of the transistor m16. A source of the transistor m1 may be coupled to a source of the transistor m2, and to a drain of the transistor i1. The transistor i1 may be configured as a current source. A source of the transistor i1 may be coupled to a lower voltage potential $V_{ss}$ of a power supply, and a gate of the transistor i1 may be coupled to a voltage $V_{bias}$.

With regard to the first output stage 304, a source of the transistor m15 is coupled to the higher voltage potential $V_{dd}$ of the power supply. A drain of the transistor m15 is coupled to a drain of the NMOS transistor m13, to the output Out−, and to a drain of the transistor m11. The transistor m13 may be configured as a diode connected transistor by coupling a gate of the transistor m13 to a drain of the transistor m13. The gate of the transistor m13 may be coupled to a gate of the transistor m12 in a current mirror configuration. In this current mirror configuration, the same amount of current may flow through the transistor m12 as flows through the transistor m13 since the two transistors may have a common gate voltage and be the same size. A source of each of the transistors m12 and m13 are coupled to a lower voltage potential $V_{ss}$ of a power supply.

With regard to the second output stage 306, a source of the transistor m16 is coupled to the higher voltage potential $V_{dd}$ of the power supply. A drain of the transistor m16 is coupled to a drain of the NMOS transistor m14, to the output Out+, and to a drain of the transistor m12. The transistor m14 may be configured as a diode connected transistor by coupling a gate of the transistor m14 to a drain of the transistor m14. The gate of the transistor m14 may be coupled to a gate of the transistor m11 in a current mirror configuration. In this current mirror configuration, the same amount of current may flow through the transistor m11 as flows through the transistor m14 since the two transistors may have a common gate voltage and be the same size. A source of each of the transistors m11 and m14 are coupled to a lower voltage potential $V_{ss}$ of a power supply.

In the circuit of FIG. 3a, the amplification characteristics of the input amplifying stage 302 may be similar to those of the circuit discussed in FIG. 2. With respect to the output stages 304 and 306, the DC offset voltage at the output Out+ may be defined by:

$$\text{Out+} = V_{gs14} = V_{ss}$$

where Vgs14 may be the gate-to-source voltage of transistor m4. Furthermore, the DC offset voltage at the output Out− may also be defined by:

$$\text{Out−} = V_{gs13} = V_{ss}$$

where $V_{gs13}$ may be the gate-to-source voltage of transistor m3. Since the transistors m3 and m4 may have similar process characteristics, the gate-to-source voltages $V_{gs13}$ and $V_{gs14}$ may be the same. Hence, the DC voltage may be the same at the outputs Out+ and Out−.

The output impedances at the outputs Out+ and Out− are described below. In order to simplify transistor circuit descriptions, all transistors may be considered to be ideal transconductors with infinite output impedances, where a voltage input results in a current output. Therefore, the infinite output impedances of m15 and m16 may not contribute to the overall output impedance with respect to Out+ and Out−. The definition of transconductance (gm) is the standard definition:

$$gm = I_{out}/V_{in}.$$

For differential signals, in which $V_{in}+=-V_{in}-$ and $V_{Out}+=-V_{Out}-$, the output impedance at the output Out+ may be given by:

$$Z_{Out+} = 1/(gm14-gm12),$$

where gm12 and gm14 are transconductances of the transistors m12 and m14, respectively. Similarly, at output Out− the output impedance for differential signals is given by:

$$Z_{Out-} = 1/(gm13-gm11),$$

where gm11 and gm13 are transconductances of the transistors m11 and m13, respectively.

For common mode signals, in which $V_{in}+=V_{in}-$ and $V_{Out}+=V_{Out}-$, the impedance at the output Out− may be given by:

$$Z_{Out+} = 1/(gm14+gm12).$$

Similarly at output Out+ the impedance for common mode signals may be:

$$Z_{Out-} = 1/(gm13+gm11)$$

Therefore, if the transistors m11, m12, m13, and m14 are fabricated so that their transconductances are equal, that is, gm11=gm12=gm13=gm14, the amplifier circuit described in FIG. 3, may provide a high gain for differential signals and a low gain for common mode signals. This is because the output voltage may be thought of as the output current times the output impedance. Therefore, for a given output current, a higher output impedance will result in a higher output voltage while a lower output impedance will result in a lower output voltage. Hence, the amplifier circuit in FIG. 3, may provide a higher gain for differential signals and a lower gain for common mode signals.

It may be desirable to fabricate the transistors m3, m4, m8, and m9 so that their transconductances are equal, that is, gm3=gm4=gm8=gm9. In order to amplify the signals from the input amplifying stage 302, it may also be desirable to fabricate the transistors m15 and m16 so that their transconductances are equal, and are some multiple N of the transconductance for m3, m4, m8, or m9. Accordingly, for a same input voltage at, for example, a gate of each of the transistors m16 and m3, DC current through the transistor m16 may be N times the DC current through m3. Since a gate of the transistor m3 may be coupled to a gate of the transistor m16, the voltages at a gate of each of the transistors m3 and m16 may be the same.

The current through the transistor m16 may be expressed in terms of the current generated by the transistor i1. If the transistor i1 generates a current 4X, then the transistors m1 and m2 will each conduct current 2X. Since the currents through the transistors m1 and m2 come from the transistors m3, m4, m8 and m9, each of those transistors will conduct current X. Therefore, the current through the transistor m16 may be N*X, or N/4 times the current through the transistor i1. Similarly, the transistor m15 may also conduct N/4 times the current through the transistor i1.

The differential outputs Out+ or Out− may be cross-coupled to the transistors m12 and m11, respectively. The transistors m11 and m12 may be coupled to the transistors m14 and m13, respectively. The transistors m13 and m14 may be coupled to the complementary differential outputs Out− and Out+, respectively. The cross-coupling may provide common mode feedback that may be utilized to keep common mode voltage at the differential outputs at a desired level. This common mode feedback circuitry may be implemented in each amplifying stage of an operational amplifier, or at selected amplifying stages, for example, the first and the final amplifying stages, of an operational amplifier.

Figure 3B:
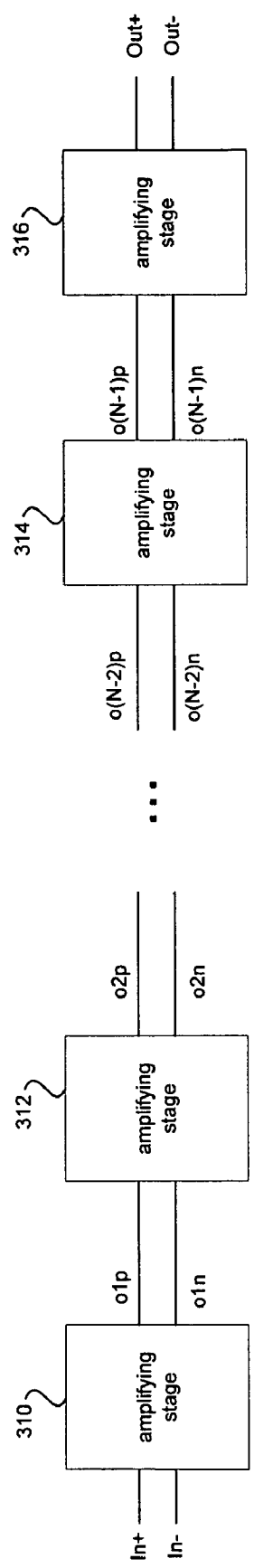
FIG. 3b is a circuit diagram illustrating a multi-stage operational amplifier architecture with simplified common mode feedback circuitry, in accordance with an embodiment of the invention.

FIG. 3b is a circuit diagram illustrating a multi-stage operational amplifier architecture with simplified common mode feedback circuitry, in accordance with an embodiment of the invention. Referring to FIG. 3b, there is shown amplifying stages 310, 312, . . . , 314, and 316. The amplifying stage 310 may be similar, for example, to the input amplifying stage 302 (FIG. 3a), and the amplifying stages 312, . . . , 314 and 316 may be, for example, similar to the output stages 304 and 306 (FIG. 3a). Each amplifying stage may comprise two differential inputs and two differential outputs. For example, the amplifying stage 310 may comprise the differential inputs In+ and In− and the differential outputs o1p and o1n. The amplifying stage 312 may comprise the differential inputs o1p and o1n and the differential outputs o2p and o2n. The amplifying stage 314 may comprise the differential inputs o(N−2)p and o(N−2)n and outputs o(N−1)p and o(N−1)n. The amplifying stage 316 may comprise the differential inputs o(N−1)p and o(N−1)n and outputs Out+ and Out−.

In operation, each of the amplifying stages 310, 312, . . . , 314 and 316 may amplify the differential input signals, for example, o(N−1)p and o(N−1)n, to generate the differential output signals, for example, Out+ and Out−. Additionally, at least one of the amplifying stages 310, 312, . . . , 314, and 316 may cross-couple each of the differential outputs of an amplifying stage, for example, Out+ and Out− of the amplifying stage 316, to a transistor that is coupled to a diode connected transistor, where the two transistors may be in a current mirror configuration. Each diode connected transistor may be coupled to a complementary differential output, for example, Out− or Out+. The cross-coupling, as described with respect to FIG. 3a, may provide common mode feedback that may be utilized to keep common mode voltage at the differential outputs at a desired level. This common mode feedback circuitry may be implemented in each amplifying stage of an operational amplifier, or at selected amplifying stages, for example, the first amplifying stage 310 and the final amplifying stage 316, of an operational amplifier.

Although specific amplifying circuits may have been described in FIGS. 3a and 3b, embodiments of the invention need not be limited so. For example, cascade and/or cascode circuits may be used to amplify input signals.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A transistor circuit, comprising:
a present amplifying stage, comprising;
a first transistor coupled to a second transistor and to a fifth transistor, wherein a gate of said first transistor is coupled to a first output of a previous amplifying stage, said second transistor is configured as a diode connected transistor, and a drain of said first transistor is coupled to a first output of said present amplifying stage;
a third transistor coupled to said second transistor, wherein said third transistor mirrors current in said second transistor;
a fourth transistor coupled to a sixth transistor and to said third transistor, wherein a gate of said fourth transistor is coupled to a second output of said previous amplifying stage, said sixth transistor is configured as a diode connected transistor, and a drain of said fourth transistor is coupled to a second output of said present amplifying stage; and
said fifth transistor coupled to said sixth transistor, wherein said fifth transistor mirrors current in said sixth transistor.

2. The transistor circuit according to claim 1, wherein a higher voltage potential of a power supply is coupled to a source of each of said first transistor and said fourth transistor, wherein said first transistor and said fourth transistor are PMOS.

3. The transistor circuit according to claim 1, wherein a lower voltage potential of a power supply is coupled to a source of each of said second transistor, said third transistor, said fifth transistor, and said sixth transistor, wherein said second transistor, said third transistor, said fifth transistor, and said sixth transistor are NMOS.

4. The transistor circuit according to claim 1, wherein said first output of said previous amplifying stage and said second output of said previous amplifying stage are complementary.

5. The transistor circuit according to claim 1, wherein said first output of said present amplifying stage and said second output of said present amplifying stage are complementary.

6. The transistor circuit according to claim 1, wherein a gate of said second transistor is coupled to a drain of said second transistor, to a gate of said third transistor, to a drain of said first transistor, and to a drain of said fifth transistor.

7. The transistor circuit according to claim 1, wherein a gate of said sixth transistor is coupled to a drain of said sixth transistor, to a gate of said fifth transistor, to a drain of said fourth transistor, and to a drain of said third transistor.

8. The transistor circuit according to claim 1, wherein said previous amplifying stage further comprises:
a seventh transistor coupled to an eighth transistor and to a ninth transistor, wherein said seventh transistor is configured as a diode connected transistor, said eighth transistor mirrors current of said seventh transistor, a gate of said ninth transistor is coupled to a first input of said previous amplifying stage, and a drain of said ninth transistor is coupled to said first output of said previous amplifying stage;
a tenth transistor coupled to an eleventh transistor and to a twelfth transistor, wherein said tenth transistor is configured as a diode connected transistor, said eleventh transistor mirrors current of said tenth transistor, a gate of said twelfth transistor is coupled to a second input of said previous amplifying stage, and a drain of said twelfth transistor is coupled to said second output of said previous amplifying stage; and
a thirteenth transistor coupled to said ninth transistor and to said twelfth transistor, wherein said thirteenth transistor is configured as a diode connected transistor.

9. The transistor circuit according to claim 8, wherein a higher voltage potential of a power supply is coupled to a source of each of said seventh transistor, said eighth transistor, said tenth transistor and said eleventh transistor, wherein said seventh transistor, said eighth transistor, said tenth transistor and said eleventh transistor are PMOS.

10. The transistor circuit according to claim 8, wherein a lower voltage potential of a power supply is coupled to a source of said thirteenth transistor, wherein said ninth transistor, said twelfth transistor, and said thirteenth transistor are NMOS.

11. The transistor circuit according to claim 8, wherein said first input of said previous amplifying stage and said second input of said previous amplifying stage are complementary.

12. The transistor circuit according to claim 8, wherein a gate of said seventh transistor is coupled to a drain of said seventh transistor, to a gate of said eighth transistor, to a drain of said ninth transistor, and to a drain of said eleventh transistor.

13. The transistor circuit according to claim 8, wherein a gate of said tenth transistor is coupled to a drain of said tenth transistor, to a gate of said eleventh transistor, to a drain of said twelfth transistor, and to a drain of said eighth transistor.

14. A method for implementing a transistor circuit, comprising:
coupling a present amplifying stage to a previous amplifying stage, wherein for said present amplifying stage;
coupling a first transistor to a second transistor and to a fifth transistor, wherein a gate of said first transistor is coupled to a first output of said previous amplifying stage, said second transistor is configured as a diode connected transistor, and a drain of said first transistor is coupled to a first output of said present amplifying stage;
coupling a third transistor to said second transistor, wherein said third transistor mirrors current in said second transistor;
coupling a fourth transistor to a sixth transistor and to said third transistor, wherein a gate of said fourth transistor is coupled to a second output of said previous amplifying stage, said sixth transistor is configured as a diode connected transistor, and a drain of said fourth transistor is coupled to a second output of said present amplifying stage; and
coupling a fifth transistor to said sixth transistor, wherein said fifth transistor mirrors current in said sixth transistor.

15. The method according to claim 14, comprising coupling a higher voltage potential of a power supply to a source of each of said first transistor and said fourth transistor, wherein said first transistor and said fourth transistor are PMOS.

16. The method according to claim 14, comprising coupling a lower voltage potential of a power supply to a source of each of said second transistor, said third transistor, said fifth transistor, and said sixth transistor, wherein said second transistor, said third transistor, said fifth transistor, and said sixth transistor are NMOS.

17. The method according to claim 14, wherein said first output of said present amplifying stage and said second output of said present amplifying stage are complementary.

18. The method according to claim 14, wherein said first output of said previous amplifying stage and said second output of said previous amplifying stage are complementary.

19. The method according to claim 14, comprising coupling a gate of said second transistor to a drain of said second transistor, to a gate of said third transistor, to a drain of said first transistor, and to a drain of said fifth transistor.

20. The method according to claim 14, comprising coupling a gate of said sixth transistor to a drain of said sixth transistor, to a gate of said fifth transistor, to a drain of said fourth transistor, and to a drain of said third transistor.

21. The method according to claim 14, comprising for said previous amplifying stage:
coupling a seventh transistor to an eighth transistor and to a ninth transistor, wherein said seventh transistor is configured as a diode connected transistor, said eighth transistor mirrors current of said seventh transistor, a gate of said ninth transistor is coupled to a first input of said previous amplifying stage, and a drain of said ninth transistor is coupled to said first output of said previous amplifying stage;
coupling a tenth transistor to an eleventh transistor and to a twelfth transistor, wherein said tenth transistor is configured as a diode connected transistor, said eleventh transistor mirrors current of said tenth transistor, a gate of said twelfth transistor is coupled to a second input of said previous amplifying stage, and a drain of said twelfth transistor is coupled to said second output of said previous amplifying stage; and
coupling a thirteenth transistor to said ninth transistor and to said twelfth transistor, wherein said thirteenth transistor is configured as a diode connected transistor.

22. The method according to claim 21, wherein a gate of said seventh transistor is coupled to a drain of said seventh transistor, to a gate of said eighth transistor, to a drain of said ninth transistor, and to a drain of said eleventh transistor.

23. The method according to claim 21, wherein a gate of said tenth transistor is coupled to a drain of said tenth transistor, to a gate of said eleventh transistor, to a drain of said twelfth transistor, and to a drain of said eighth transistor.

24. The method according to claim 21, comprising coupling a higher voltage potential of a power supply to a source of each of said seventh transistor, said eighth transistor, said tenth transistor and said eleventh transistor, wherein said seventh transistor, said eighth transistor, said tenth transistor and said eleventh transistor are PMOS.

25. The method according to claim 21, comprising coupling a lower voltage potential of a power supply to a source of said thirteenth transistor, wherein said ninth transistor, said twelfth transistor, and said thirteenth transistor are NMOS.

26. The method according to claim 21, wherein said first input of said previous amplifying stage and said second input of said previous amplifying stage are complementary.

27. A method for differentially amplifying, comprising:
receiving, via a plurality of amplifying circuitry at a present amplifying stage, input signals from a previous amplifying stage;
generating amplified output signals via said plurality of amplifying circuitry;
communicating a first of said amplified output signals to a portion of a first current mirror circuit;
communicating a second of said amplified output signals to a portion of a second current mirror circuit;
communicating said first of said amplified output signals to said second current mirror circuit; and
communicating said second of said amplified output signals to said first current mirror circuit.

28. The method according to claim 27, wherein said input signals received from said previous amplifying stage are complementary.

29. The method according to claim 27, wherein said amplified output signals are complementary.

30. The method according to claim 27, wherein said plurality of amplifying stages comprises a first transistor and a fourth transistor.

31. The method according to claim 27, wherein said first current mirror circuit comprises a second transistor and a third transistor.

32. The method according to claim 27, wherein said second current mirror circuit comprises a fifth transistor and a sixth transistor.

33. The method according to claim 27, wherein said previous amplifying stage comprises:
   receiving a first input signal via a ninth transistor and a second input signal via a twelfth transistor; and
   generating a first output signal by said ninth transistor and a second output signal by said twelfth transistor, wherein current is provided for said ninth transistor by a seventh transistor, an eleventh transistor, and a thirteenth transistor, and current is provided for said twelfth transistor by an eighth transistor, a tenth transistor, and said thirteenth transistor; and wherein said eighth transistor mirrors current in said seventh transistor and said eleventh transistor mirrors current in said tenth transistor.

34. The method according to claim 27, wherein said previous amplifying stage is substantially similar to said present amplifying stage.

* * * * *